US006291325B1

(12) United States Patent
Hsu

(10) Patent No.: US 6,291,325 B1
(45) Date of Patent: Sep. 18, 2001

(54) ASYMMETRIC MOS CHANNEL STRUCTURE WITH DRAIN EXTENSION AND METHOD FOR SAME

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/195,392

(22) Filed: Nov. 18, 1998

(51) Int. Cl.[7] ............................................. H01L 21/425
(52) U.S. Cl. ..................................... 438/525; 438/527
(58) Field of Search ................................. 438/525, 527; 257/335

(56) References Cited

U.S. PATENT DOCUMENTS

| | | | |
|---|---|---|---|
| 5,510,279 | 4/1996 | Chien et al. | 437/41 |
| 5,891,782 | * 7/2000 | Hsu et al. | 438/302 |
| 6,093,951 | * 7/2000 | Burr | 257/408 |

FOREIGN PATENT DOCUMENTS

487220 * 5/1992 (EP) .

* cited by examiner

Primary Examiner—Caridad Everhart
(74) Attorney, Agent, or Firm—David C. Ripma; Matthew D. Rabdau; Scott C. Krieger

(57) ABSTRACT

A method of forming a MOS transistor without a lightly doped drain (LDD) region between the channel region and drain is provided. The channel region and a drain extension are formed from two separate tilted ion implantation processes, after the deposition of the gate electrode. The tilted implantation forms a relatively short channel length, with respect to the length of the gate electrode. The position of the channel is offset, and directly adjoins the source. A second tilted implant process forms a drain extension region under the gate electrode, adjacent the drain. Elimination of LDD areas reduces the number of masking and doping steps required to manufacture a transistor. Further, the drain extension area promotes transistor performance, by eliminating source resistance. At the same time, sufficient doping of the drain extension area insures that the drain resistance through the drain extension remains low. This drain extension acts to more evenly distribute electric fields so that large breakdown voltages are possible. In this manner, larger $I_d$ currents and faster switching speeds are obtained. A MOS transistor having a short, offset channel and drain extension formed through dual tilted ion implants is also provided.

29 Claims, 9 Drawing Sheets

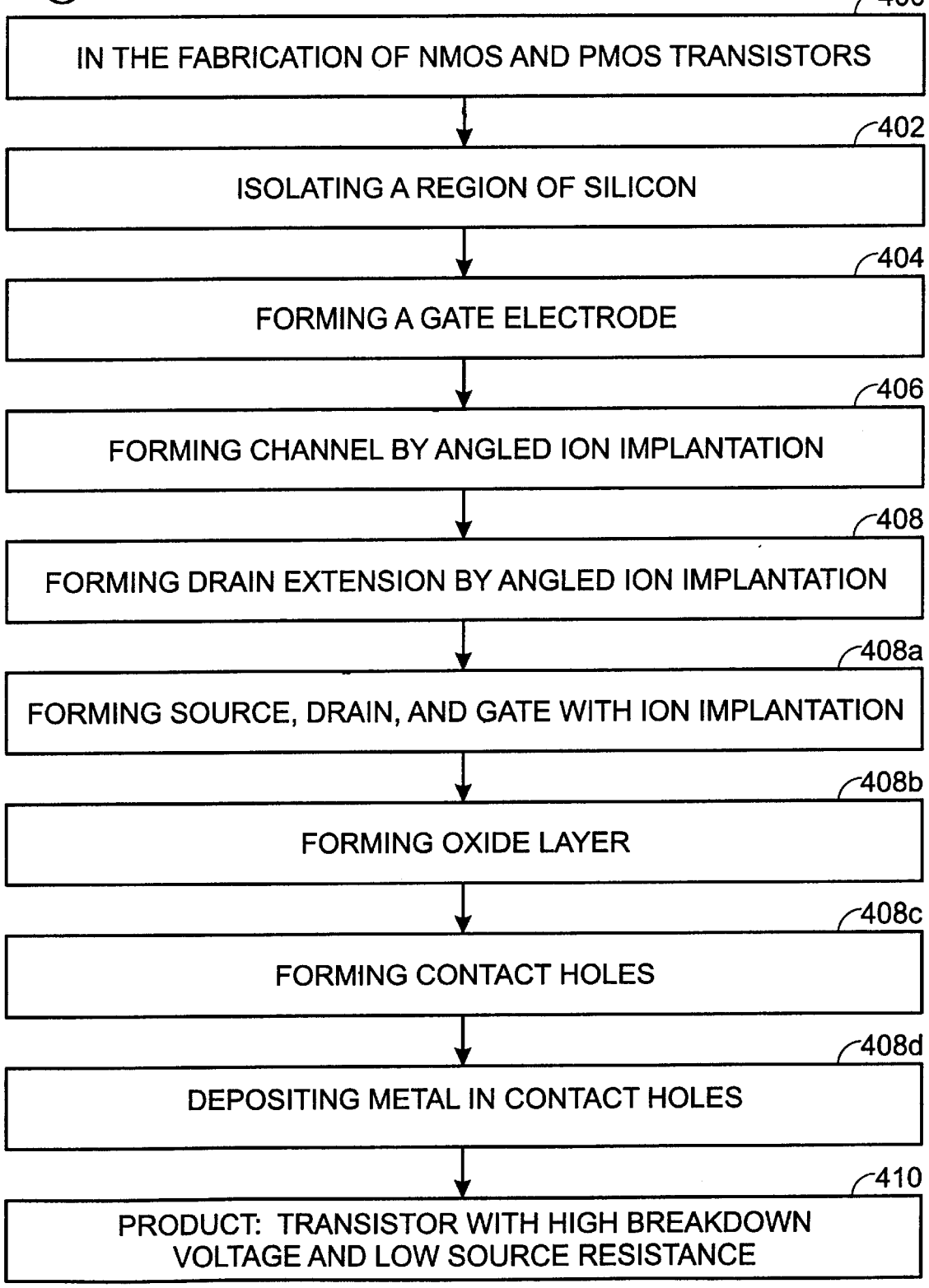

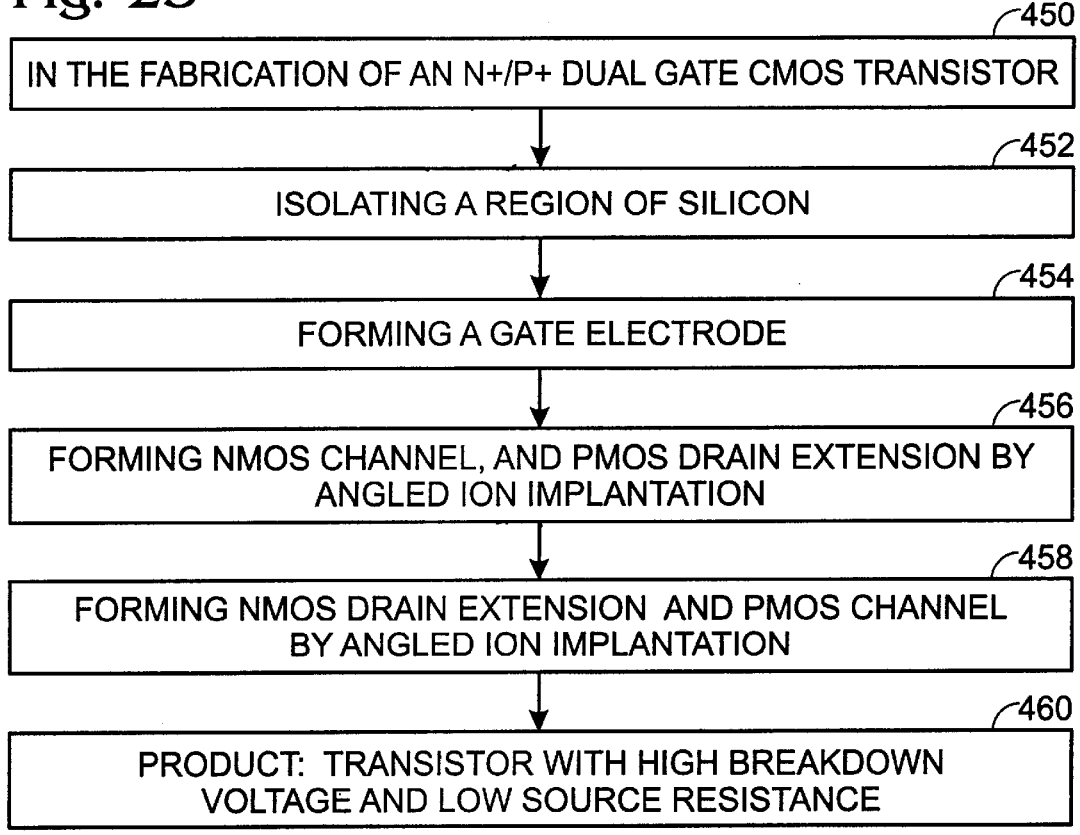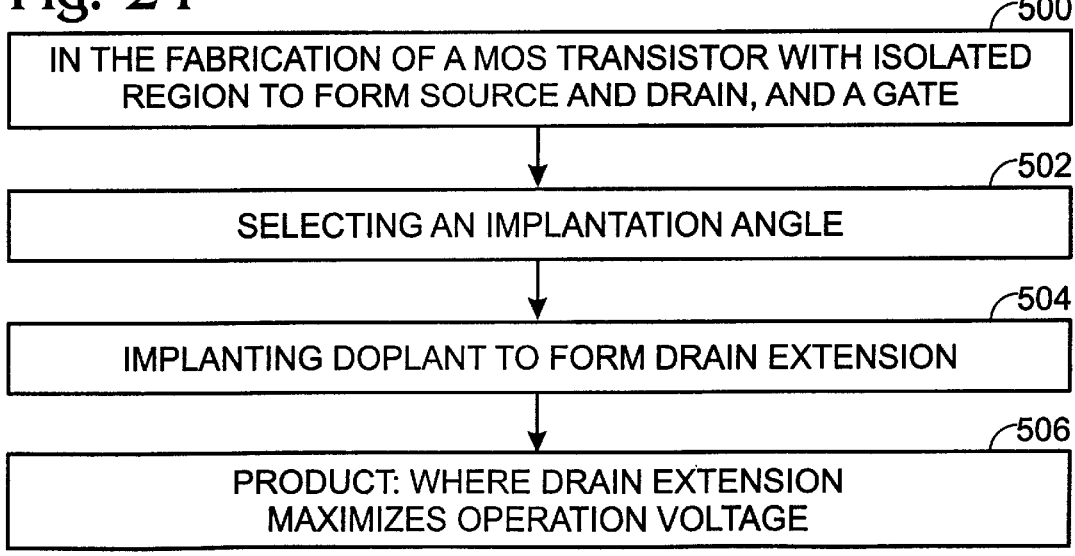

ASYMMETRIC MOS CHANNEL STRUCTURE WITH DRAIN EXTENSION AND METHOD FOR SAME

BACKGROUND AND SUMMARY OF THE INVENTION

This invention relates generally to semiconductor technology and, more specifically, to the formation of MOS transistors with short, asymmetrical, channel regions and lightly doped drain extension regions formed through a double angled implantation process.

An important subject of ongoing research in the semiconductor industry is the reduction in the dimensions of devices used in integrated circuits. Planar transistors such as metal oxide semiconductor (MOS) transistors are particularly suited to use in high density integrated circuits. As the size of MOS transistors and other active devices decreases, the dimensions of the source/drain/gate electrodes, and the channel region of each device, must decrease correspondingly.

When fabricating MOS transistors, the source and drain electrodes are typically heavily doped to reduce the parasitic resistance of the device. While the doping improves conductance, it increases parasitic capacitance, and lowers the breakdown voltage. Many prior art devices interpose lightly doped drain ODD) regions on either side of the channel region, between the channel region and the source/drain electrodes. These LDD regions permit the MOS devices to develop adequate breakdown voltages. However, these LDD regions also increase the resistance between the source and drain when the transistor is turned on. This increased parasitic resistance degrades the switching speed and current carrying capabilities of the transistor. The necessity of LDD regions also adds process steps to fabrication which negatively affect both cost and reliability.

A MOS transistor suitable to control the gating and amplification of high speed signals must have a low parasitic capacitance, low parasitic resistance, and a breakdown voltage larger than the signals which are carried. These performance parameters represent design tradeoffs well known to those skilled in the art of MOS transistor fabrication.

Most prior art MOS transistors have channel regions that are substantially the same size as the overlying gate electrode. The channel region size and shape is a direct result of implanting dopants in the silicon underlying the gate electrode to form source/drain electrodes and LDD regions, after the deposition of the gate electrode. The wide channel region formed in such as process contribute undesirable characteristics to a transistor's performance. It is commonly acknowledged that the drain current is inversely proportional to the length of the channel.

Procedures exist in the prior art to implant the area under the gate electrode with dopant to change performance characteristics of the transistor. A tilted ion implant is performed to insure a good overlay between the gate the source electrodes. That is, to insure a portion of the source electrode underlies the gate. A halo implant is typically performed in the eight sides surrounding a gate electrode, preventing the occurrence of the short channel effect, or leakage current. However, these techniques have not been used to substantially change the size and position of the channel region underlying the gate electrode.

In a co-pending patent application, Ser. No. 08/918,678, entitled "Asymmetric Channel Doped MOS Structures and Method for Same", invented by Hsu et al., filed on Aug. 21, 1997, and assigned to the assignees of the instant application, a transistor structure and formation method were disclosed to form an asymmetric channel region through a single angled ion implantation. A drain extension region permits large break down voltage without source resistance. Further, the drain extension eliminates the need for lightly doped drain regions (LDD), so that process steps are saved.

It would be advantageous to provide a MOS transistor with a large breakdown voltage that is fabricated without LDD regions between the channel region and the source and drain electrodes, thereby reducing the parasitic resistance of the transistor.

It would be advantageous to provide a MOS transistor with a shorter channel length to permit the conduction of larger drain currents.

It would be advantageous to provide a MOS transistor with a higher switching speed and drain current carrying capabilities.

It would be advantageous to provide a MOS transistor with fewer fabrication steps, fewer implantations of dopant, and fewer barrier structures to improve reliability and lower costs.

It would be advantageous to provide a MOS transistor with an asymmetric channel, as described above, with a more heavily doped drain extension region to minimize drain resistance.

Accordingly, in the fabrication of transistors selected from the group consisting of NMOS and PMOS transistors, a method for forming asymmetric channel regions and drain extension regions has been provided. The method comprises the steps of.

a) isolating and doping a region of silicon in which the transistor is to be formed;

b) forming a gate electrode region overlying the silicon region, the gate electrode region having a length extending from the source to the drain, and vertical sidewalls adjoining the source and drain;

c) forming a channel region through a tilted implantation of dopant at a predetermined angle, into the silicon region underlying the gate on the source side to form a channel region having a length less than the gate length, the channel region extending from underneath the gate electrode vertical sidewall directly adjacent the source, toward the drain; and d) forming a drain extension through tilted implantation of dopant at a predetermined angle, into the silicon region underlying the gate on the drain side, the drain extension region extending from underneath the gate electrode vertical sidewall directly adjacent the drain, toward the source, whereby a transistor is formed with a high breakdown voltage and low source resistance.

In some aspects of the invention, Step c) occurs before Step d). Alternately, Step d) occurs before Step c). Further steps, following Step d), include:

e) implanting a fourth dopant at a fourth ion dose and fourth ion energy level, to complete the formation of the gate, source and drain regions.

f) depositing a layer of oxide over the source, drain, and gate regions of the transistor;

g) forming contact holes through the oxide deposited in step e), to the source, drain, and gate regions; and h) depositing metal in the contact holes, forming independent electrical connections to the source, drain, and gate.

Typically, Step c) includes masking the drain region to prevent the implantation of dopant ions during step c).

Likewise, Step d) includes masking the source region to prevent the implantation of dopant ions during step d). Steps c) and d) includes using an ion implantation angle in the range between 30° and 70°, preferably 60°, from the vertical sidewall of the gate electrode adjoining the drain and source, respectively.

The above-described method is convenient for the fabrication of N+/P+ Dual Poly Gate CMOS transistors. Then, Step c) includes forming the channel region in the NMOS transistors while, simultaneously, forming the drain extension region in the PMOS transistors, and Step d) includes forming the drain extension in NMOS transistors while, simultaneously, forming the channel region in the PMOS transistors.

N+/P+ Dual Poly Gate CMOS transistors and MOS transistors, including NMOS and PMOS transistors, having asymmetric short channel regions, and drain extension regions have also been provided. The transistors comprise isolated silicon regions, including a source and a drain. Gate electrodes overlie the silicon regions with a length extending from the source to the drain. A silicon channel region having a channel length less than the gate length, underlies the gate and extends from the source, toward the drain. The channel region is formed by implanting ions of dopant at a predetermined angle, from the source side of the gate electrode, into the channel region. The transistor also comprises a silicon drain extension region extending underneath the gate from the drain, toward the channel region. The drain extension region is formed by implanting ions of dopant at a predetermined angle, from the drain side of the gate electrode, into the drain extension region. In this manner, the short channel region minimizes drain capacitance, and a lightly doped drain extension maximizes drain operation voltage.

Typically, the transistor includes a layer of oxide over the source, drain, and gate regions of the transistor with contact holes through the oxide, to the source, drain, and gate regions. Metal in the contact holes forms independent electrical connections to the source, drain, and gate, whereby the transistor is interfaced with other electrical circuits.

The NMOS drain and the PMOS source regions are masked during the angled ion implantation of the NMOS channel and the PMOS drain extension regions. Likewise, the NMOS source and the PMOS drain regions are masked during the angled ion implantation of the NMOS drain extension and PMOS channel regions.

The PMOS drain extension regions are formed by angled implantation of a dopant selected from the group consisting of boron and $BF_2$. The ion dose is in the range between $1 \times 10^{13}$ and $1 \times 10^{15}/cm^2$. The ion energy level is in the range between 2 keV and 30 keV when the dopant is boron, and the ion energy level is in the range between 10 keV and 150 keV when the dopant is $BF_2$. The NMOS drain extension regions are formed by implanting a dopant selected from the group consisting of phosphorus and arsenic. The ion dose is in the range between $1 \times 10^{13}$ and $1 \times 10^{15}/cm^2$. The ion energy level is in the range between 10 keV and 100 keV when the dopant is phosphorus, and the ion energy level is in the range between 20 keV and 200 keV when said dopant is arsenic.

BRIEF DESCRIPTION OF THE DRAWINGS

FIG. 22 is a flowchart illustrating a method for forming asymmetric channel regions and drain extension regions.

FIG. 23 is a flowchart illustrating a method for forming asymmetric channel regions, and drain extension regions.

FIG. 24 is a flowchart illustrating a method for forming a drain extension region underlying the gate electrode.

DETAILED DESCRIPTION OF THE PREFERRED EMBODIMENT

Figure 1:
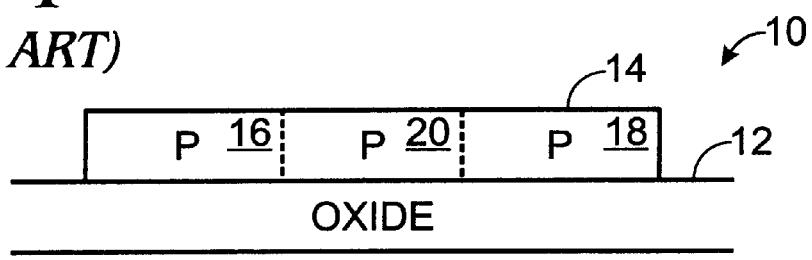
FIGS. 1–3 are partial cross-sectional views of steps in the completion of a MOS transistor (prior art).
Figure 2:
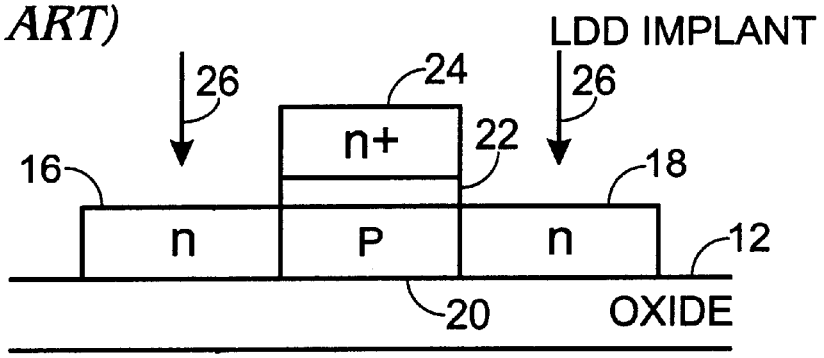
Figure 3:
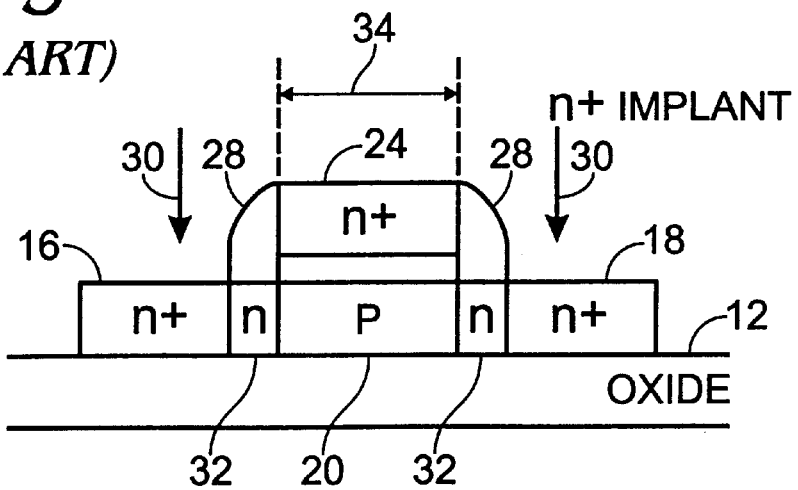

FIGS. 1–3 are partial cross-sectional views of steps in the completion of a MOS transistor 10 (prior art). In FIG. 1, transistor 10 is being fabricated from a SIMOX (separation by implantation of oxygen) substrate which includes an oxide layer 12 and an overlying silicon layer 14. Silicon layer 14 has, initially, been doped with a p type impurity. Silicon layer 14 is masked and etched to isolate it from other silicon regions of the integrated circuit (IC). Subsequently formed are a source 16, drain, 18, and a channel 20.

FIGS. 1–3 describe an NMOS type transistor 10. Alternately, the fabrication of a PMOS transistor can be described with essentially the same process. Both NMOS and PMOS transistor are also formed from bulk silicon, as opposed to SIMOX or silicon on insulator (SOI). In forming an NMOS transistor with bulk silicon, a well of p-doped silicon is formed in a substrate of n-type silicon material, from which the channel, source, and drain are subsequently formed. After the formation of a gate, the bulk silicon transistor is substantially the same as transistor 10 in FIG. 2. The following processes for the bulk silicon and SIMOX methods are essentially the same. In the interest of brevity, prior art methods for forming PMOS transistors, and MOS transistors fabricated from bulk silicon are not illustrated.

FIG. 2 is a cross-sectional view of transistor 10 of FIG. 1 following the deposition and etching of a gate oxide layer 22, and the deposition of a semiconductor material to form gate electrode 24. Gate electrode is heavily n+ doped. A lightly doped drain implantation (LDD) follows the formation of gate 24. The LDD implant is represented by arrows 26 directed to source 16 and drain 18. Gate 24 shields channel region 20 from implantation 26.

FIG. 3 is a cross-sectional view of transistor 10 of FIG. 2 following the formation of gate sidewalls 28. An n+ ion implantation represented by arrows 30 is directed toward source 16 and drain 18 to make these n+ regions. Sidewalls 28 shield a portion of source 16 and drain 18 adjacent channel 20 from n+ implanting 30 to form LDD regions 32. As is well known in the art, LDD regions 32 act to distribute the electric field formed between the p and n+ regions, increasing the breakdown voltage between channel 20 and drain 18. Channel 20 and gate electrode 24 have substantially the same length, represented by reference designator 34. LDD regions 32 are important to maintain a high breakdown voltage, but the LDD regions 32 add resistance to the current path between source 16 and drain 18 and increase the time constant associated with switching the transistor.

Figure 4:
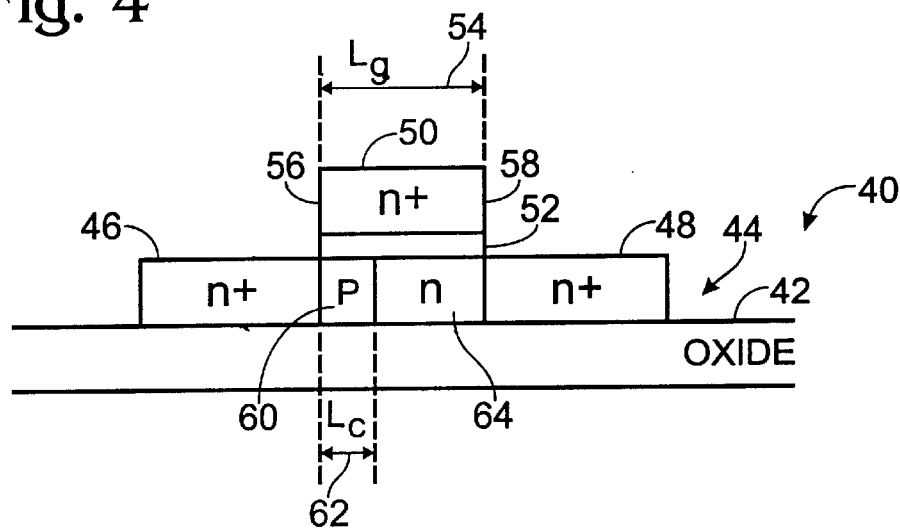
FIG. 4 is a partial cross-sectional view of an NMOS transistor having an asymmetric, short channel region (co-pending art).

FIG. 4 is a partial cross-sectional view of an NMOS transistor 40 having a short, asymmetric channel region. Transistor 40 includes an oxide layer 42, and overlying isolated silicon region 44 (co-pending art). Silicon region 44 includes an n+ source 46 and an n+ drain 48. A gate electrode 50 overlies gate oxide layer 52 and silicon region 44, and has a length ($L_g$) 54 extending from source 46 to drain 48. In one aspect of the invention, gate electrode length 54 is less than approximately 0.5 microns. Gate electrode 50 also has vertical sidewalls 56 and 58 respectively adjoining source 46 and drain 48.

A p-silicon channel 60 having a length ($L_c$) 62 less than gate length 54, underlies gate 50 and extends from underneath gate electrode vertical sidewall 56 adjoining source 46, toward drain 48. An n-silicon drain extension region 64 extends underneath gate 50 from p-channel region 60, to drain 48. Short channel region 60 is formed between source 46 and drain 48 to minimize drain 48 capacitance. Drain extension 64, between channel region 60 and drain 48, permits a large breakdown voltage to develop. In some aspects of the invention, drain extension 64 is significantly longer than LDD region 32 between channel 20 and drain 18 in the prior art transistor 10 depicted in FIG. 3. Therefore, the breakdown voltage developed by the transistor of the present invention is significantly higher. Referring again to FIG. 4, the present invention completely eliminates an LDD region between channel 60 and source 46, which decreases the resistance between source 46 and drain 48 and the improves time constants associated with the switching speed of transistor 40.

Transistor 40 is shown with source 46, drain 48, channel 60, and drain extension 64 formed on a SIMOX silicon layer. The silicon layer is masked, and etched, to isolate region 44. Alternately, source 46, drain 48, channel 60, and drain extension 64 are formed on silicon from a bulk silicon substrate (not shown). When an NMOS transistor is formed from bulk silicon, a p-well is created in n-type bulk silicon, and a thin surface layer of silicon is n-doped. Alternately, a silicon area is isolated in p-type bulk silicon, and a thin n-doped surface layer is formed. This n-doped layer is substantially the same as isolated silicon region 44 in FIG. 4. Once isolated silicon region 44 is formed, the process steps for bulk silicon and SIMOX are essentially the same. The structures identified above, and in FIG. 4, are the same for transistor 40 when formed from bulk silicon.

Figure 5:
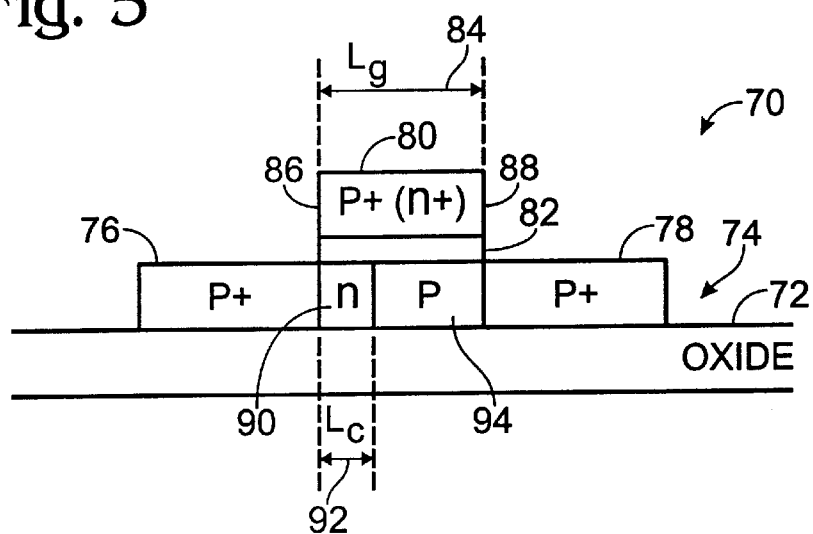
FIG. 5 is a partial cross-sectional view of a PMOS transistor having a short, asymmetric channel region (co-pending art).

FIG. 5 is a partial cross-sectional view of a PMOS transistor having a short, asymmetric channel region (co-pending art). Transistor 70 includes an oxide layer 72, and overlying isolated silicon region 74. Silicon region 74 includes a p+ source 76 and a p+ drain 78. A gate electrode 80 overlies gate oxide layer 82 and silicon region 74, and has a length ($L_g$) 84 extending from source 76 to drain 78. In one aspect of the invention, gate electrode length 84 is less than approximately 0.5 microns. Gate electrode 80 also has vertical sidewalls 86 and 88 respectively adjoining source 76 and drain 78. As is well known in the art, gate electrode 80 is fabricated with a polysilicon or other suitable material. PMOS transistor 70 fabricated with a p+ doped gate 80. Alternately, gate 80 is doped n+.

An n-doped silicon channel 90 has a length ($L_c$) 92 less than gate length 84, underlies gate 80 and extends from underneath gate electrode vertical sidewall 86 adjoining source 76, toward drain 78. A p-silicon drain extension region 94 extends underneath gate 80 from n-channel region 90, to drain 78. Short channel region 90 is formed between source 76 and drain 78 to minimize drain 78 capacitance. The exact doping densities of channel region 90 and drain extension 94 are varied to obtain a suitable threshold voltage and drain extension conductance in response to whether gate electrode 80 is doped p+ or n+.

Transistor 70 is shown with source 76, drain 78, channel 90, and drain extension 94 formed on a SIMOX layer. The silicon layer is masked, and etched to isolate region 74. Alternately, source 76, drain 78, channel 90, and drain extension 94 are formed from bulk silicon (not shown). That is, silicon region 74 is formed by p-doping an area of silicon overlying an n-well in p-type bulk silicon. Alternately, a layer in n-type bulk silicon is isolated and p-doped. This p-doped layer is substantially the same as isolated silicon region 74 in FIG. 5. Once isolated silicon region 74 is formed, the process steps for bulk silicon and SIMOX are essentially the same. The structures identified above, and in FIG. 5, are the same for transistor 70 when formed from bulk silicon.

Figure 6:
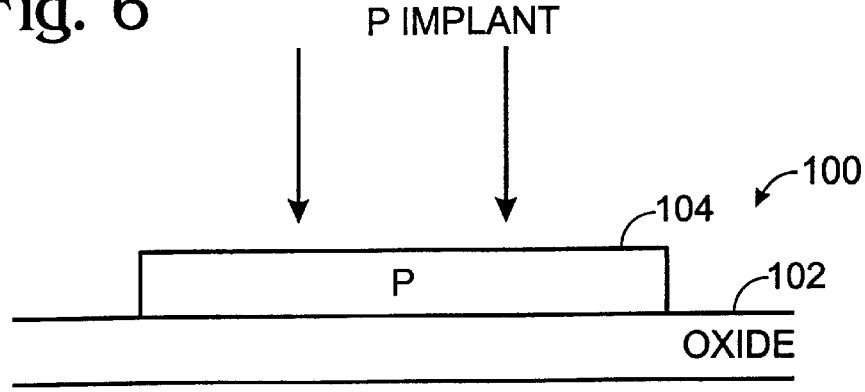
FIGS. 6–10 are partial cross-sectional views of steps in the formation of a completed MOS transistor 40 with a short, asymmetric channel region (co-pending art).

FIGS. 6–10 are partial cross-sectional views of steps in the formation of a completed MOS transistor with an asymmetric, short channel region (co-pending art). The MOS transistor is selected from the group consisting of NMOS and PMOS transistors. FIG. 6 is a partial cross-section view of a PMOS transistor 100. Transistor 100 is formed on a SIMOX substrate including an oxide layer 102 overlying isolated silicon region 104. Isolated silicon region 104 is implanted with impurities to form p-type silicon.

Alternately, PMOS transistor 100 is formed on an n-well of p-type bulk silicon, or on n-type bulk silicon, as described above in the discussion of FIG. 5. A thin layer of the n-type silicon is implanted with boron to form a p-layer substantially the same as silicon region 104. $BF_2$ is alternately used to form p-layer 104.

Figure 7:
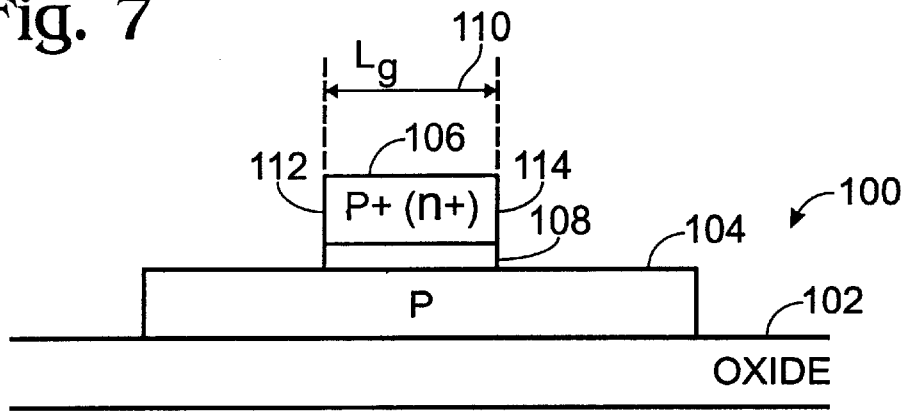

FIG. 7 is a partial cross-sectional view of transistor 100 of FIG. 6 with a gate electrode 106 and gate oxide layer 108 overlying silicon region 104. Gate electrode 106 has a length ($L_g$) 110 extending from the subsequently formed source to the subsequently formed drain. Gate electrode 106 also has a vertical sidewall 112 adjoining the subsequently formed source, and a vertical sidewall 114 adjoining the subsequently formed drain.

Figure 8:
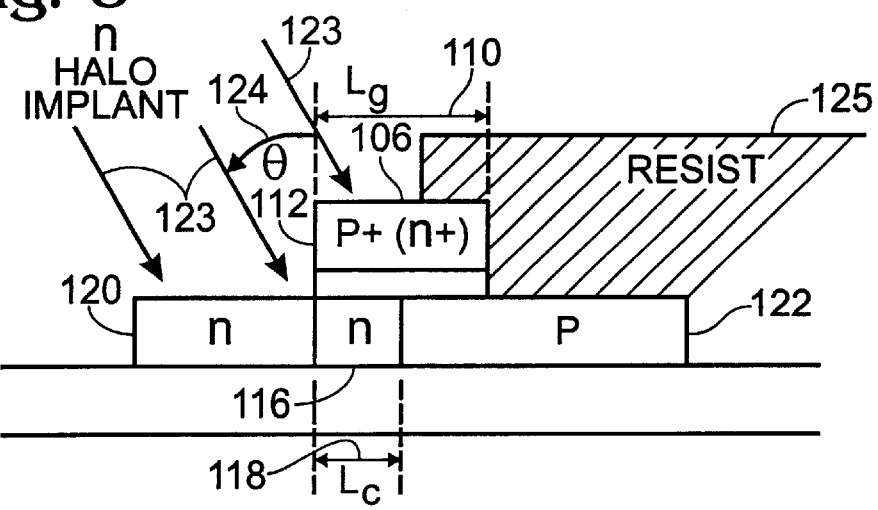

FIG. 8 is a partial cross-sectional view of transistor 110 of FIG. 7 with a silicon channel region 116 having a length ($L_c$) 118 less than gate length 110, underlying gate 106 and extending from underneath gate electrode vertical sidewall 112 adjoining source 120, toward drain 122. Channel region 116 is formed by implanting ions of dopant, represented by arrows 123, at an angle (θ) 124 defined from gate electrode vertical sidewall 112 adjacent source 120, into channel region 116.

Tilted angle implant 123 permits the channel region 116 to be doped after the gate electrode 106 is formed. Angle 124 of dopant ion implantation 123 is in the range between 30° and 70° from vertical sidewall 112 of gate electrode 106 adjoining source 120. Preferably, angle 124 is approximately 60°. Since a portion of silicon region 104 underlying gate 106 is shielded by gate 106 during implantation, channel region 116 has a length 118 less than the gate length 110. Further, the shielding by gate 106 results in the asymmetric placement of channel region 116 closer to source 120 than to drain 122. Drain region 122 is masked with resist 125, during ion implantation 123 to prevent the penetration of doping impurities into drain 122.

Channel region 116 is formed by implanting a dopant selected from the group consisting of phosphorus and arsenic. The ion dose in the range between $1\times10^{13}$ and $1\times10^{14}/cm^2$. The ion energy level is in the range between 10 keV and 100 keV when the dopant is phosphorus, and the ion energy level is in the range between 20 keV and 200 keV when the dopant is arsenic. An n-type channel region 116 is formed.

Alternately, a hybrid technique is used to form channel region 116, combining features of the present invention with a dopant diffusion technique. Tilted implantation 123 is performed with angle 124 being less than approximately 30° from vertical sidewall 112 of gate electrode 106, so that source 120 is doped, but channel 116 is only partially doped. That is, dopant implantation 123 doesn't extend completely into channel region 116 as shown in FIG. 8. Then, the dopant is permitted to diffuse into channel region 116 by heating transistor 100 to temperatures in the range between 850 and 1100° C. for a time in the range between 30 and 60 minutes. Thus, asymmetric channel region 116 results when angle 124 of ion implantation 123 is shallow.

Figure 9:
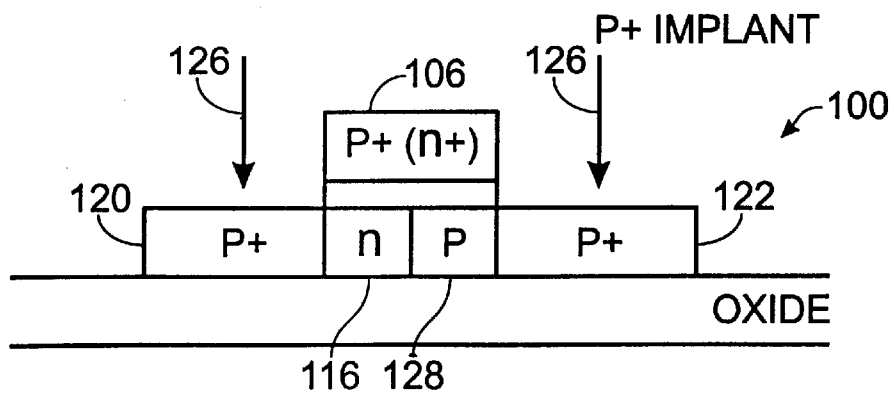

FIG. 9 is a partial cross-sectional view of transistor 100 of FIG. 8 with an ion implantation of dopant, represented by arrows 126, to form source 120 and drain 122. The p+ implantation 126 forms p+ source 120 and drain 122 regions. A p-type silicon drain extension 128 extends underneath gate 106 from channel region 116, to drain 122. Drain extension 128 is formed in an area underlying gate 106 that is typically a part of the channel region in prior art transistors. Gate electrode 106 shields drain extension 128 from angled ion implantation when channel region 116 is formed (FIG. 8). Gate electrode 106 also shields drain extension 128 from ion implantation when source 120 and drain 122 are doped p+. Drain extension 128 permits a large breakdown voltage to develop between channel 116 and drain 122 without the necessity of forming LDD regions, as in prior art transistors (see LDD region 32 of FIG. 3).

In the interest of brevity, an equivalent NMOS transistor is not shown. However, the structures and fabrication processes are essentially the same as those described above for PMOS transistor 100, and depicted in FIGS. 6–10. An n+ gate electrode is formed in an NMOS transistor. An angled ion implantation forms a short, asymmetric p-channel region. The channel region results from implanting a dopant selected from the group consisting of boron and $BF_2$. The ion dose is in the range between $1\times10^{13}$ and $1\times10^{14}/cm^2$. The ion energy level is in the range between 2 keV and 30 keV when the dopant is boron, and the ion energy level is in the range between 10 keV and 150 keV when the dopant is $BF_2$. The drain extension region remains n, while the source and drain are later doped to become n+.

As explained in the discussion of NMOS transistor 40 in FIG. 4, source 120, drain 122, channel 116, and drain extension 128 are formed in silicon from the group consisting of SIMOX and bulk silicon. After a few basic bulk silicon process steps, the transistors made from these different types of silicon are fabricated in essentially the same manner.

Figure 10:
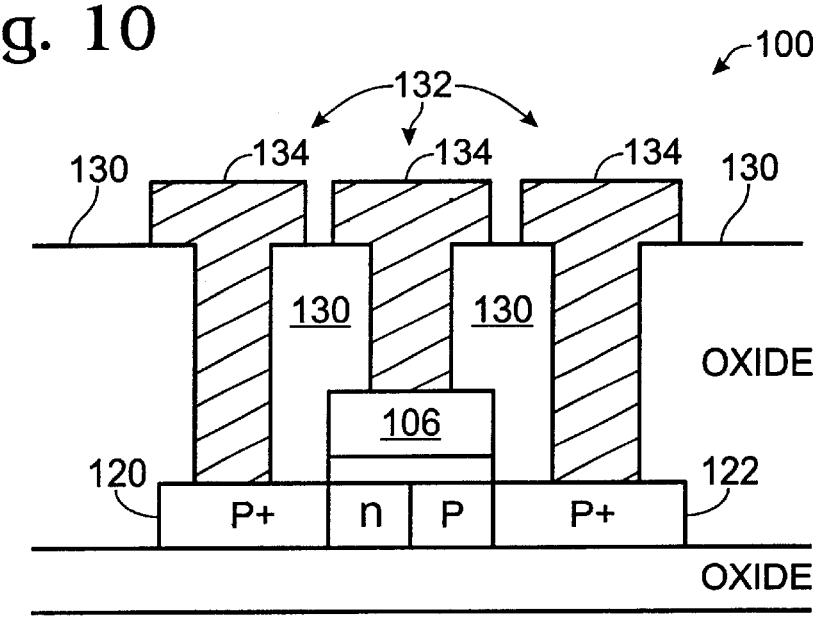

FIG. 10 is a partial cross-sectional view of transistor 100 of FIG. 9 further comprising a layer of oxide 130 over said source 120, drain 122, and gate 106 regions of transistor 100 with contact holes 132 through oxide 130, to source 120, drain 122, and gate 106 regions. Transistor 100 also comprises metal 134 in contact holes 132 to form independent electrical connections to source 120, drain 122, and gate 106. In this manner, transistor 100 interfaces with other electrical circuits (not shown).

Figure 11:
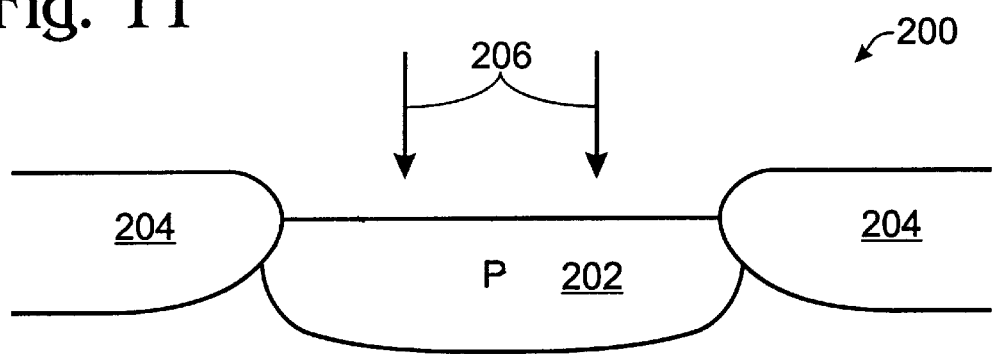
FIGS. 11–14 illustrate steps in the formation of a complete MOS transistor of the present invention, selected from the group consisting of NMOS and PMOS transistors.

FIGS. 11–14 illustrate steps in the formation of a complete MOS transistor of the present invention having an asymmetric short channel region and a drain extension region, selected from the group consisting of NMOS and PMOS transistors. FIG. 11 illustrates transistor 200 comprising an isolated silicon region 202. Subsequently formed source, drain, channel, and drain extension regions are formed on silicon selected from the group consisting of bulk silicon and silicon on insulator (SOI). For contrast to the previously presented SOI structures, a bulk silicon transistor 200 is shown. Because of the angled implantation process, explained below, initial doping of the silicon area beneath the subsequently formed gate electrode is not critical in SOI processes, as the channel region overlies an insulator. It is a feature of the invention that the SOI transistor of the present invention, either NMOS or PMOS, can be formed on either an n or p doped substrate.

As in any bulk silicon method, a well 202 is doped in the bulk silicon, and insulation areas 204 are formed around well 202. When MOS transistor 200 is an NMOS transistor, silicon region 202 is formed (from bulk silicon) using boron as the first dopant. The doping is represented by reference designators 206. The first doping density in the range from $1\times10^{15}$ to $1\times10^{17}/cm^3$. In this manner, a p-doped silicon region is formed. For simplicity, only an NMOS transistor is shown in FIGS. 11–14. However, when the MOS transistor is a PMOS transistor, silicon region 202 is formed from bulk silicon using a first dopant 206 selected from the group consisting of phosphorous and arsenic, at a first doping density in the range between $1\times10^{15}$ and $1\times10^{17}/cm^3$. In this manner, an n-doped silicon region is formed.

Figure 12:
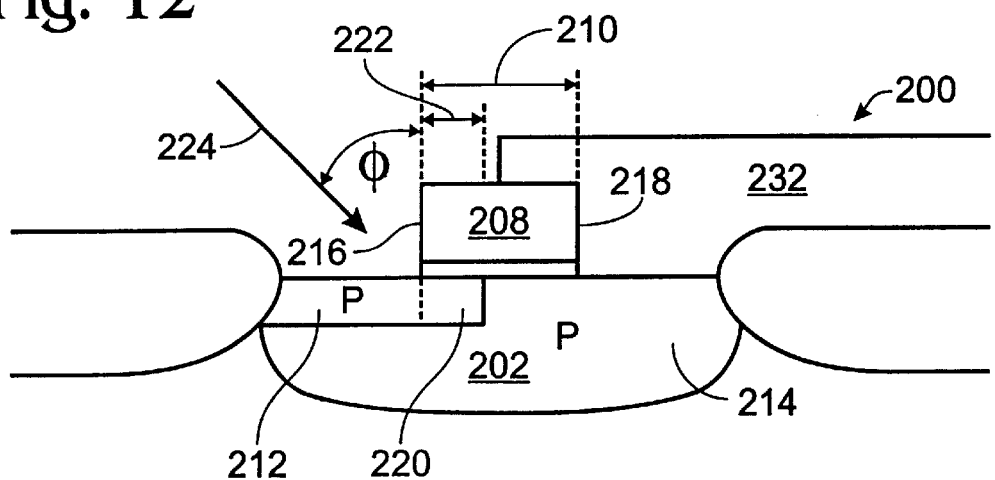

FIG. 12 illustrates transistor 200 of FIG. 11 with a gate electrode 208 overlying silicon region 202. Gate electrode 208 has a length 210 extending from source 212 to drain 214, and includes vertical sidewalls 216 and 218 adjoining said source 212 and drain 214. Typically, gate 208 is doped upon deposition, with n+ doping, for example.

A silicon channel region 220, having a channel length 222 less than gate length 210, underlies gate 208 and extends from underneath gate electrode vertical sidewall 216 adjoining source 212, toward drain 214. Channel region 220 is formed by implanting ions of dopant at a predetermined angle ($\phi$), defined from gate electrode vertical sidewall 216 adjacent source 212, into channel region 220.

NMOS channel region 220 is formed from a second dopant, represented by reference designator 224, selected from the group consisting of boron and $BF_2$. The second ion dose is in the range between $1\times10^{13}$ and $1\times10^{15} 1cm^2$. The second ion energy level is in the range between 2 keV and 30 keV when second dopant 224 is boron, and the second ion energy level is in the range between 10 keV and 150 keV when second dopant 224 is $BF_2$. In this manner, a short p-channel region 220 is formed.

When a PMOS channel region is formed (not shown), second dopant 224 is selected from the group consisting of phosphorus and arsenic. The second ion dose is in the range between $1\times10^{13}$ and $1\times10^{15}/cm^2$. The second ion energy level is in the range between 10 keV and 100 keV when second dopant 224 is phosphorus, and the second ion energy level is in the range between 20 keV and 200 keV when second dopant 224 is arsenic, whereby a short n-channel region 220 is formed.

Figure 13:
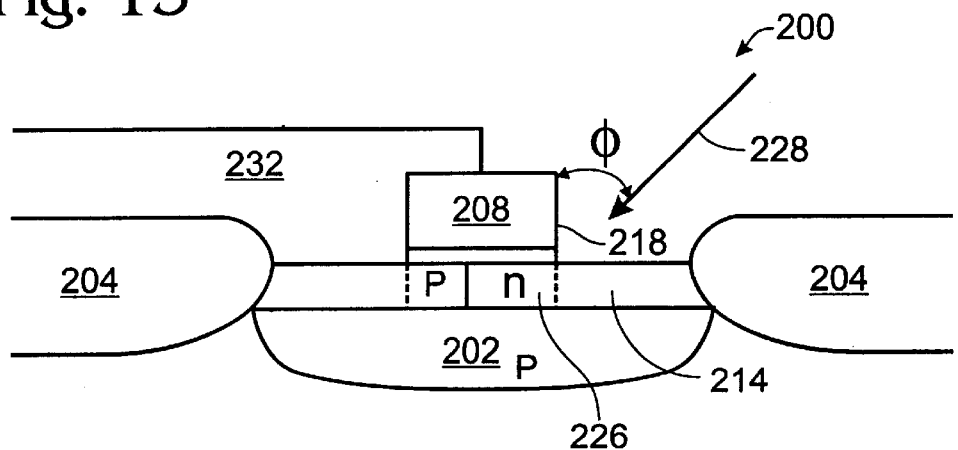

FIG. 13 illustrates transistor 200 of FIG. 12 with a silicon drain extension region 226 extending underneath gate 208 from drain 214, toward channel region 220. Drain extension region 226 is formed by implanting ions of dopant at a predetermined angle (φ), defined from gate electrode vertical sidewall 218 adjacent drain 214, into drain extension region 226. The angle of ion implantation is in the range between 30° and 70° from vertical sidewalls 218 of gate electrode 208. Preferably, the angle is approximately 60°. Likewise, in FIG. 12, the angle of implantation is in the same range, as described above, from vertical sidewall 216, in the formation of channel region 220.

A NMOS drain extension region 226 is formed by implanting a third dopant 228 selected from the group consisting of phosphorus and arsenic. The ion third dose is in the range between $1\times10^{13}$ and $1\times10^{15}/cm^2$. The third ion energy level is in the range between 10 keV and 100 keV when dopant 228 is phosphorus, and the third ion energy level is in the range between 20 keV and 200 keV when dopant 228 is arsenic. In this manner, short channel region 220 minimizes drain capacitance, and lightly doped drain extension 226 maximizes drain operation voltage.

In a similar manner, PMOS drain extension regions 226 (not shown) are formed by implanting third dopant 228 selected from the group consisting of boron and $BF_2$. The third ion dose is in the range between $1\times10^{13}$ and $1\times10^{15}/cm^2$. The third ion energy level is in the range between 2 keV and 30 keV when dopant 228 is boron, and the third ion energy level is in the range between 10 keV and 150 keV when dopant 228 is $BF_2$.

Returning to FIG. 12, drain region 214 is masked with mask 232 during the angled implant required to form channel region 220. As shown in FIG. 13, source region 212 is masked during the angled implant required to from drain extension 226. It is a feature of the invention that in an integrated circuit including both NMOS and PMOS transistors, channel regions 220 in NMOS transistors are simultaneously formed with drain extension regions 226 in PMOS transistors. That is, in FIG. 12 NMOS drain 214 and PMOS source regions (not shown) are masked, with a material such as photoresist 232, during the angled ion implantation of NMOS channel 220 and PMOS drain extension regions (not shown). Depending on the application, varying portions of gate region 208 are also masked during the angled implant. Returning again the FIG. 13, NMOS source 212 and PMOS drain regions (not shown) are masked during the angled ion implantation of NMOS drain extension 226 and PMOS channel regions (not shown). The simultaneous formation of NMOS and PMOS transistors is explored more fully, below.

In some aspects of the invention, channel region 220 and drain extension 226 are further formed (after doping) by heating transistor 200 to a temperature in the range between 850 and 1100° C. for a time in the range between 30 and 60 minutes to diffuse implanted dopant 224. In this manner, asymmetric channel 220 and drain extension regions 226 result when the angle of ion implantation is shallow.

Figure 14:
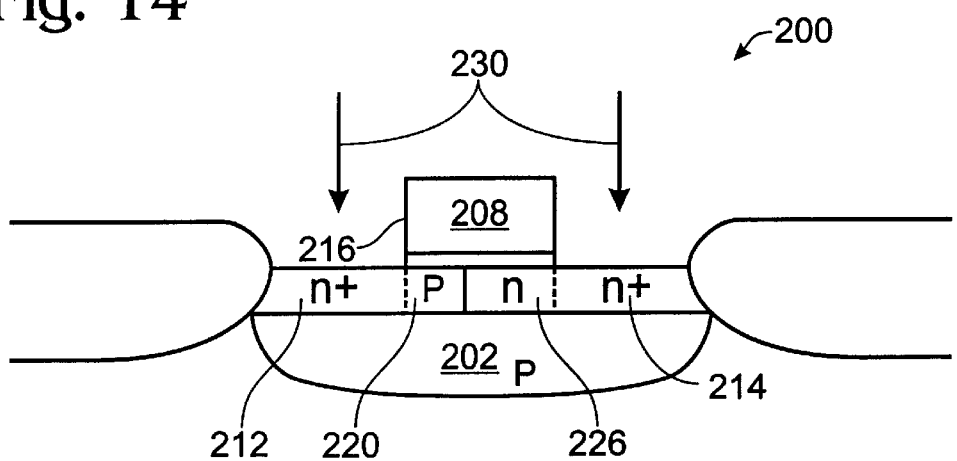

FIG. 14 illustrates transistor 200 of FIG. 13 with fully formed source 212, drain 214, and gate 208 regions. When transistor 200 is NMOS, source 212, drain 214, and gate 208 regions are formed from a fourth dopant 230 selected from the group consisting of phosphorus and arsenic. The fourth ion dose is in the range between $1\times10^{15}$ and $1\times10^{16}/cm^2$. The fourth ion energy level is in the range between 5 keV and 20 keV when fourth dopant 230 is phosphorus, and the fourth ion energy level is in the range between 10 keV and 40 keV when fourth dopant 230 is arsenic. In this manner, n+ gate 208, source 212, and drain 214 regions are formed. If previously undoped, gate 208 is doped during this process.

Likewise, but not shown, when transistor 200 is PMOS, source 212, drain 214, and gate 208 regions are formed from fourth dopant 230 selected from the group consisting of $BF_2$ and boron. The fourth ion dose is in the range between $1\times10^{15}$ and $1\times10^{16}/cm^2$. The fourth ion energy level is in the range between 10 keV and 50 keV when fourth dopant 230 is $BF_2$, and the fourth ion energy level is in the range between 2 keV and 10 keV when fourth dopant 230 is boron. In this manner, p+ gate 208, source 212, and drain 214 regions are formed.

FIG. 14 shows channel region 220 contacting drain extension 226. In other aspects of the invention (not shown), a portion of the initially (first doping) p-doped silicon separates channel region 220 from drain extension 226. Alternately, drain extension region 226 forms into a previously formed channel region 220 under gate electrode 208. In some aspects of the invention, channel region 220 forms into a previously formed drain extension region 226.

FIGS. 15–21 illustrate steps in the formation of a complete N+/P+ Dual Poly Gate CMOS transistor having asymmetric short channel regions, and drain extension regions. It is understood that N+/P+ Dual Poly Gate transistor 250 includes NMOS and PMOS transistors. The formation of N+/P+ Dual Poly Gate transistor 250 is similar to the formation of transistor 200 in FIGS. 11–14 above. The formation of N+/P+ Dual Poly Gate CMOS transistor 250 illustrates more clearly simultaneous NMOS and PMOS formation steps.

Figure 15:
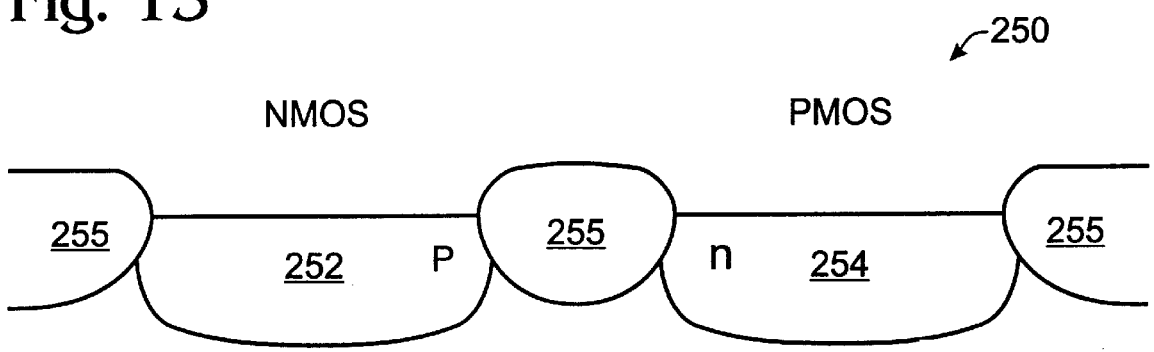
FIGS. 15–21 illustrate steps in the formation of a complete N+/P+ Dual Poly Gate CMOS transistor having asymmetric short channel regions, and drain extension regions.

FIG. 15 illustrates isolated silicon regions 252 and 254, including subsequently formed source and drain regions. As above with transistor 200, subsequently formed source, drain, channel, and drain extension regions are formed on silicon selected from the group consisting of bulk silicon and silicon on insulator (SOI). As the initial doping is not critical with SOI, a bulk silicon dual gate transistor 250 is shown. Insulation 255 separates transistor active areas.

NMOS transistor silicon region 252 is formed from bulk silicon using boron as a first dopant. The first doping density in the range between $1\times10^{15}$ and $1\times10^{17}/cm^3$, whereby p-doped silicon region 252 is formed. PMOS transistor silicon region 254 is formed from bulk silicon using a first dopant selected from the group consisting of phosphorous and arsenic. The first doping density in the range between $1\times10^{15}$ and $1\times10^{17}/cm^3$, whereby n-doped silicon region 254 is formed.

Figure 16:
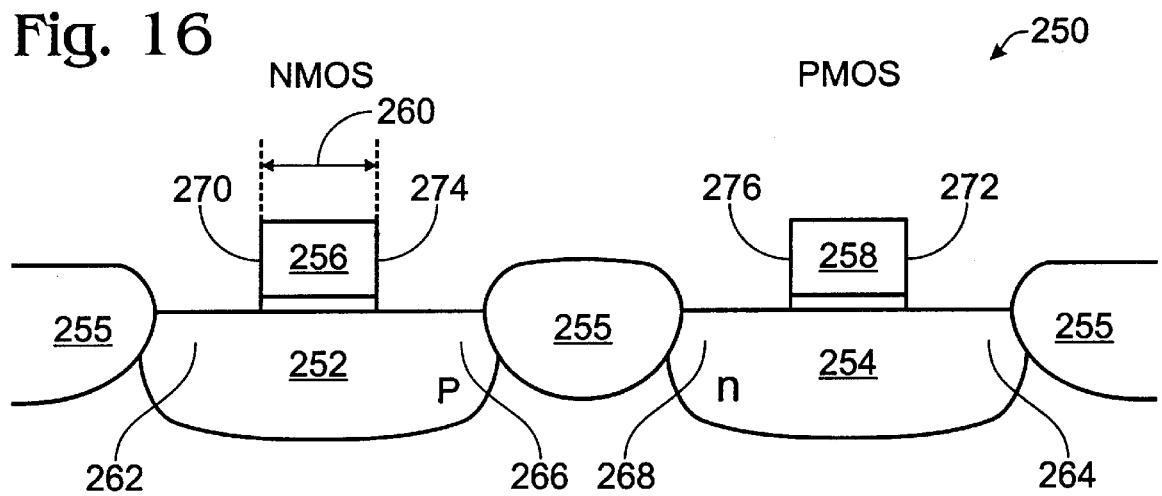

FIG. 16 illustrates N+/P+ Dual Poly Gate transistor 250 of FIG. 15 with gate electrodes 256 and 258 overlying silicon regions 252 and 254, respectively. Gates 256/258 have a length 260 extending from source 262/264 to drain 266/268, and includes vertical sidewalls 270 and 272 adjoining source 262 and 264, respectively. Vertical sidewalls 274 and 276 adjoin drain 266 and 268, respectively. Typically, gate electrodes 256/258 are left undoped until later in the fabrication process.

Figure 17:
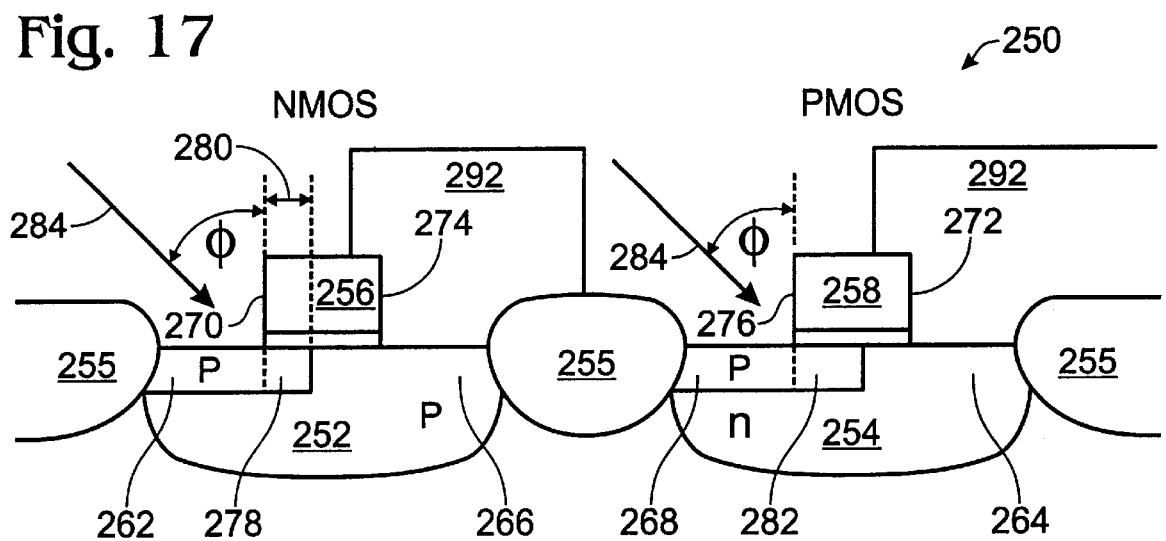

FIG. 17 illustrates N+/P+ Dual Poly Gate transistor 250 of FIG. 16 with NMOS channel regions and PMOS drain extension regions. With regard to the NMOS transistor, silicon channel region 278 has a channel length 280 less than gate length 260 (see FIG. 16), and underlies gate 256, extending from underneath gate electrode vertical sidewall 270 adjoining source 262, toward drain 266. Channel region 278 is formed by implanting ions of dopant at a predetermined angle (φ), defined from gate electrode vertical sidewall 270 adjacent source 262, into channel region 278.

With regard to the PMOS transistor, a silicon drain extension region 282 extends underneath gate 258 from drain 268, toward the subsequently formed channel region. Drain extension region 282 is formed by implanting ions of dopant at a predetermined angle (φ), defined from gate electrode vertical sidewall 276 adjacent drain 268, into drain extension region 268. In this manner, short channel region 278 minimizes drain capacitance, and lightly doped drain extension 282 maximizes drain operation voltage.

NMOS channel region 278 is formed from a second dopant 284 selected from the group consisting of boron and BF$_2$. The second ion dose is in the range between $1 \times 10^{13}$ and $1 \times 10^{15}/\text{cm}^2$. The second ion energy level is in the range between 2 keV and 30 keV when second dopant 284 is boron, and the second ion energy level is in the range between 10 keV and 150 keV when second dopant 284 is BF$_2$. In this manner, short p-channel region 278 is formed.

PMOS transistor drain extension 282 is formed from second dopant 284, with the specific dopants, dosages, and energy levels described above. As in FIGS. 11–14, the angle of ion implantation is in the range between 30° and 70° from vertical sidewalls 270/276 of gate electrodes 256/258, respectively. Preferably, the angle is approximately 60°. It is a feature of the invention that NMOS channel region 278 is formed simultaneously with said PMOS drain extension region 282.

Figure 18:
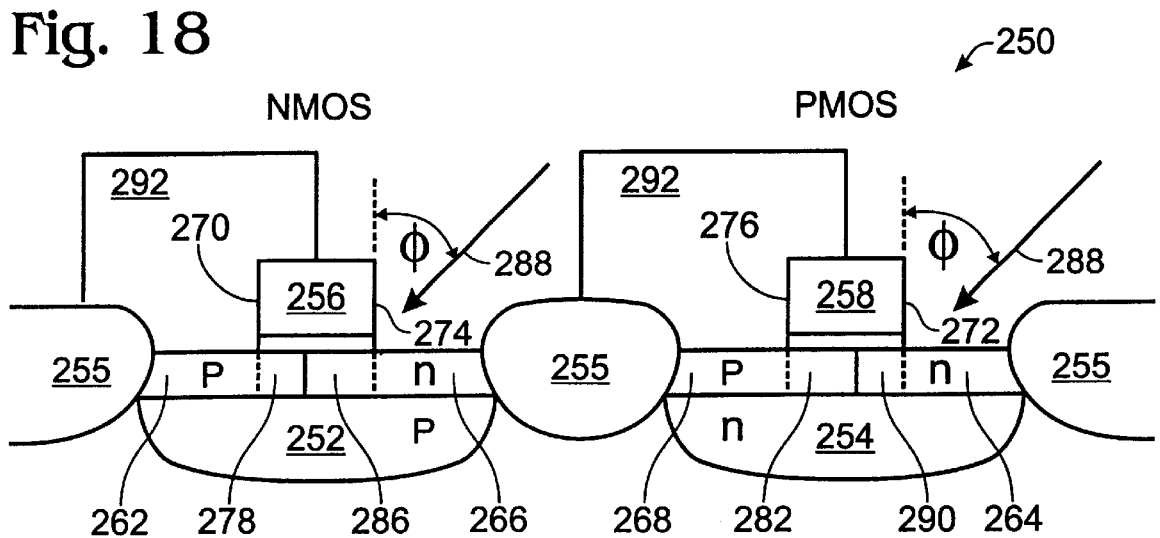

FIG. 18 illustrates transistor 250 of FIG. 17 with NMOS drain extension regions and PMOS channel regions. NMOS drain extension region 286 is formed from a third dopant 288 selected from the group consisting of phosphorus and arsenic. The third ion dose is in the range between $1 \times 10^{13}$ and $1 \times 10^{15}/\text{cm}^2$. The third ion energy level is in the range between 10 keV and 100 keV when third dopant 288 is phosphorus, and the third ion energy level is in the range between 20 keV and 200 keV when third dopant 288 is arsenic. PMOS transistor channel region 290 is formed from third dopant 288 using the specific materials, dosages, and energy levels mentioned above. In this manner, short n-channel region 290 is formed.

As in FIGS. 11–14, the angle of ion implantation (φ) is in the range between 30° and 70° from vertical sidewalls 272/274 of gate electrodes 258/256, respectively. Preferably, the angle is approximately 60°. It is a feature of the invention that NMOS drain extension region 286 is formed simultaneously with PMOS channel region 290. Likewise, NMOS channel region 278 is formed simultaneously with PMOS drain extension region 282. Further, the order of angled implantation is not limited to the steps describing FIGS. 17 and 18, above. In some aspects of the invention, NMOS drain extension 286 and PMOS channel 290 are formed before NMOS channel 278 and PMOS drain extension 282.

Channel regions 278/290 and drain extensions 282/286 are further formed with an annealing process, in some aspects of the invention. Transistor 250 is heated to a temperature in the range between 850 and 1100° C. for a time in the range between 30 and 60 minutes to diffuse the implanted dopant 284 and 288. In this manner, asymmetric channel 278/290 and drain extension 282/286 regions result when the angle of ion implantation is shallow.

In FIGS. 17, NMOS drain 266 and PMOS source 264 regions are masked during the angled ion implantation of NMOS channel 278 and PMOS drain extension regions 282. The masking is performed with an insulator or photoresist material 292. Likewise, in FIG. 18 NMOS source 262 and PMOS drain 268 regions are masked during the angled ion implantation of NMOS drain extension 286 and PMOS channel 290 regions.

Figure 19:
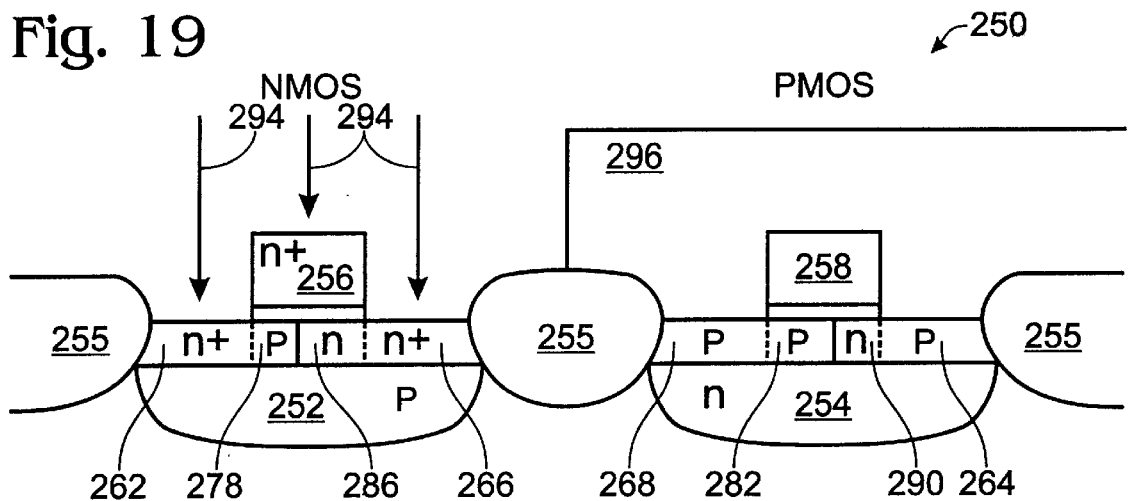

FIG. 19 illustrates transistor 250 of FIG. 18 with NMOS source 262, drain 266, and gate 256 regions. NMOS source 262, drain 266, and gate 256 electrodes are formed from a fourth dopant 294 selected from the group consisting of phosphorus and arsenic. The fourth ion dose is in the range between $1 \times 10^{15}$ and $1 \times 10^{16}/\text{cm}^2$. The fourth ion energy level is in the range between 5 keV and 20 keV when fourth dopant 294 is phosphorus, and the fourth ion energy level is in the range between 10 keV and 40 keV when fourth dopant 294 is arsenic. In this manner, n+ gate 256, source 262, and drain 266 regions are formed. The PMOS transistor is masked with a mask 296 during this process.

Figure 20:
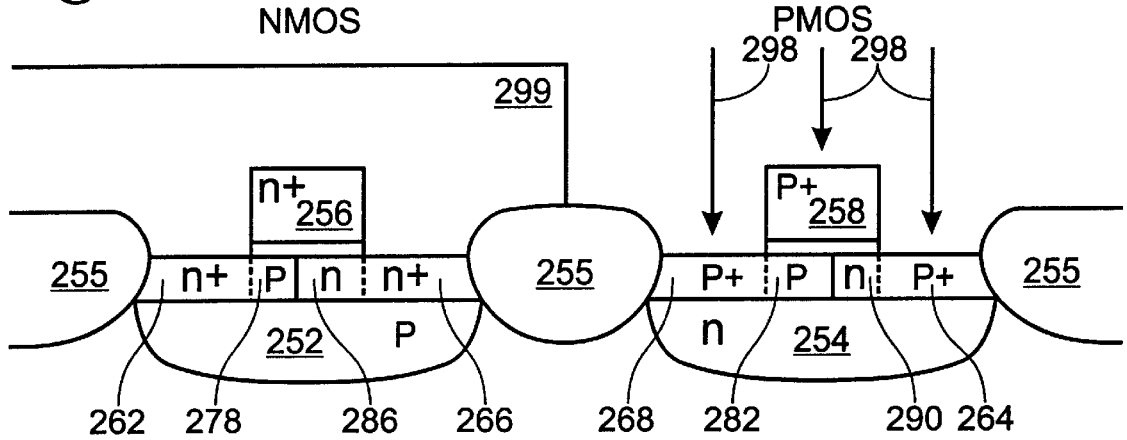

FIG. 20 illustrates transistor 250 of FIG. 19 with PMOS source 264, drain 268, and gate 258 regions. PMOS source 264, gate 258, and drain 268 regions are formed from a fifth dopant 298 selected from the group consisting of BF$_2$ and boron. Fifth ion dose is in the range between $1 \times 10^{15}$ and $1 \times 10^{16}/\text{cm}^2$. The fifth ion energy level is in the range between 10 keV and 50 keV when fifth dopant is BF$_2$, and fifth ion energy level is in the range between 2 keV and 10 keV when fifth dopant 298 is boron. In this manner, p+ gate 258, source 264, and drain 268 regions are formed. The NMOS transistor is masked with mask 299 during this process. Alternately, the fifth doping process occurs before the fourth doping process.

Figure 21:
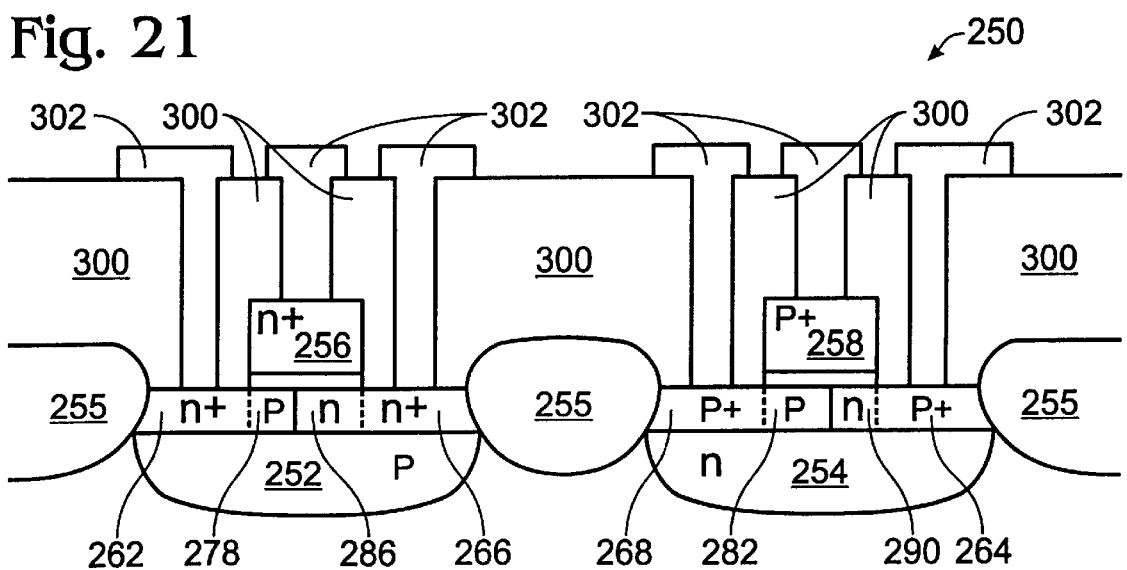

FIG. 21 is transistor 250 of FIG. 20 with interlevel interconnections. Transistor 250 further comprises a layer of oxide 300 over source 262/264, drain 266/268, and gate 256/258 regions of transistor 250 with contact holes through oxide 300, to source 262/264, drain 266/268, and gate 256/258 regions. Metal 302 in the contact holes forms independent electrical connections to source 262/264, drain 266/268, and gate 256/258 regions, whereby transistor 250 is interfaced with other electrical circuits (not shown).

FIG. 22 is a flowchart illustrating a method for forming asymmetric channel regions and drain extension regions. Step 400 provides for the fabrication of transistors selected from the group consisting of NMOS and PMOS transistors. Step 402 isolates a region of silicon, from which a source, a drain, and a channel region between the source and drain, are subsequently formed, and dopes the region. The doping of Step 402 includes implanting ions of a first dopant at a first doping density. Step 402 includes forming the silicon region to be doped from the group consisting of bulk silicon and silicon on insulator (SOI).

Step 404 forms a gate electrode region overlying the silicon region. The gate electrode region has a length extending from the source to the drain, and vertical sidewalls adjoining the source and drain. Step 404 includes forming a gate electrode having a length of less than approximately 0.5 microns. Step 406 forms the channel region by implanting ions of dopant at a predetermined angle, defined from the gate electrode vertical sidewall adjacent the source, into the silicon region underlying the gate to form a channel region having a length less than the gate length. The channel region extends from underneath the gate electrode vertical sidewall directly adjacent the source, toward the drain. Step 406 includes implanting a second dopant at a second ion dose and second ion energy level. Step 408 forms the drain extension by implanting ions of dopant at a predetermined angle, defined from the gate electrode vertical sidewall adjacent the drain, into the silicon region underlying the gate. The drain extension region extends from underneath the gate electrode vertical sidewall directly adjacent the drain, toward the source. Step 408 includes implanting a third dopant at a third ion does and third energy level. Step 410 is a product, where a transistor is formed with a high breakdown voltage and low source resistance. In some aspects of the invention, Step 406 occurs before Step 408. Alternately, Step 408 occurs before Step 406.

In some aspects of the invention, further steps follow Step 408. Step 408a implants a fourth dopant at a fourth ion dose and fourth ion energy level, to form gate, source and drain regions. Step 408b deposits a layer of oxide over the source, drain, and gate regions of the transistor. Step 408c forms contact holes through the oxide deposited in step 408b, to the source, drain, and gate regions. Step 408d deposits metal in the contact holes, forming independent electrical connections to the source, drain, and gate.

In some aspects of the invention, Step 406 includes masking the drain region to prevent the implantation of dopant ions into the drain region during Step 406. Likewise, Step 408 includes masking the source region to prevent the implantation of dopant ions into the source region during step 408.

Steps 406 and 408 include using an ion implantation angle in the range between 30° and 70° from the vertical sidewall of the gate electrode adjoining the drain and source, respectively. Preferably, the ion implantation angle is approximately 60°.

In some aspects of the invention, Step 400 provides the MOS transistor being an NMOS transistor. Then, Step 402 includes forming the silicon region from bulk silicon with boron as the first dopant. The first doping density in the range between $1\times10^{15}$ and $1\times10^{17}/cm^3$, whereby a p-doped silicon region is formed. Further, Step 406 includes a second dopant selected from the group consisting of boron and $BF_2$. The second ion dose is in the range between $1\times10^{13}$ and $1\times10^{15}/cm^2$. The second ion energy level is in the range between 2 keV and 30 keV when the second dopant is boron, and the second ion energy level is in the range between 10 keV and 150 keV when the second dopant is $BF_2$, whereby a short p-channel region is formed.

Step 408 includes a third dopant selected from the group consisting of phosphorus and arsenic. The third ion dose is in the range between $1\times10^{13}$ and $1\times10^{15}/cm^2$. The third ion energy level is in the range between 10 keV and 100 keV when the third dopant is phosphorus, and the third ion energy level is in the range between 20 keV and 200 keV when the third dopant is arsenic. In this manner, a drain extension region is formed. Finally, Step 408a includes the fourth dopant being selected from the group consisting of phosphorus and arsenic, in which the fourth ion dose is in the range between $1\times10^{15}$ and $1\times10^{16}/cm^2$. The fourth ion energy level is in the range between 5 keV and 20 keV when the fourth dopant is phosphorus, and the fourth ion energy level is in the range between 10 keV and 40 keV when the fourth dopant is arsenic, whereby n+ gate, source, and drain regions are formed.

When Step 400 provides the MOS transistor being a PMOS transistor, Step 402 includes forming the silicon region from bulk silicon, using a first dopant selected from the group consisting of phosphorous and arsenic. A first doping density is used in the range between $1\times10^{15}$ and $1\times10^{17}/cm^3$, whereby an n-doped silicon region is formed. Step 406 includes a second dopant selected from the group consisting of phosphorus and arsenic. The second ion dose is in the range between $1\times10^{13}$ and $1\times10^{15}/cm^2$. The second ion energy level is in the range between 10 keV and 100 keV when the second dopant is phosphorus, and the second ion energy level is in the range between 20 keV and 200 keV when the second dopant is arsenic, whereby a short n-channel region is formed.

Step 408 includes the third dopant being selected from the group consisting of $BF_2$ and boron. The third ion dose is in the range between $1\times10^{13}$ and $1\times10^{15}/cm^2$. The third ion energy level is in the range between 10 keV and 150 keV when the third dopant is $BF_2$, and the third ion energy level is in the range between 2 keV and 30 keV when the third dopant is boron. In this manner, a p drain extension region is formed. Step 408a includes the fourth dopant being selected from the group consisting of $BF_2$ and boron. The fourth ion dose is in the range between $1\times10^{15}$ and $1\times10^{16}/cm^2$. The fourth ion energy level is in the range between 10 keV and 50 keV when the fourth dopant is $BF_2$, and the fourth ion energy level is in the range between 2 keV and 10 keV when the fourth dopant is boron, whereby a p+ gate, source, and drain regions are formed.

In some aspects of the invention (not shown), a further step follows Steps 406 and 408. Step 408e heating the transistor to a temperature in the range between 850 and 1100° C., for a time in the range between 30 minutes and 60 minutes to diffuse the dopant implanted in Steps 406 and 408, whereby an asymmetrical channel and drain extension are formed when the angle of implantation is shallow.

FIG. 23 is a flowchart illustrating a method for forming asymmetric channel regions, and drain extension regions. Step 450 provides for the fabrication of N+/P+ Dual Poly Gate CMOS transistors, including NMOS and PMOS transistors. Step 452 isolates regions of silicon, from which a source, a drain, and a channel region between the source and drain, are subsequently formed, and dopes the regions. Step 454 forms gate electrode regions overlying the silicon region, each gate electrode region having a length extending from the source to the drain, and vertical sidewalls adjoining the source and drain. Step 456 forms the channel region in the NMOS transistors by implanting ions of dopant at a predetermined angle, defined from the gate electrode vertical sidewall adjacent the source, into the silicon region underlying the gate. In this manner, a channel region is formed having a length less than the gate length, extending from underneath the gate electrode vertical sidewall directly adjacent the source, toward the drain. Simultaneously, the drain extension region is formed in the PMOS transistors by implanting ions of dopant at a predetermined angle, defined from the gate electrode vertical sidewall adjacent the drain, into the silicon region underlying the gate. A drain extension region is formed extending from underneath the gate electrode vertical sidewall directly adjacent the drain, toward the source. Step 456 includes masking the drain regions of the NMOS transistors and the source regions of the PMOS transistors to prevent the implantation of dopant ions during Step 456.

Step 458 forms the drain extension in NMOS transistors by implanting ions of dopant at a predetermined angle, defined from the gate electrode vertical sidewall adjacent the drain, into the silicon region underlying the gate to form the drain extension region. The drain extension region extends from underneath the gate electrode vertical sidewall directly adjacent the drain, toward the source. Simultaneously, the channel region is formed in the PMOS transistors by implanting ions of dopant at a predetermined angle, defined from the gate electrode vertical sidewall adjacent the source, into the silicon region underlying the gate. A channel region is formed having a length less than the gate length, extending from underneath the gate electrode vertical sidewall directly adjacent the source, toward the drain. Step 460 is a product, a transistor with a high breakdown voltage and low source resistance.

In some aspects of the invention, Step 456 occurs before Step 458. Alternately, Step 458 occurs before Step 456. Step 458 includes masking the drain regions of the PMOS transistors and the source regions of the NMOS transistors to prevent the implantation of dopant ions during Step 458. Likewise, Step 456 includes masking the drain regions of the NMOS transistors and the source regions of the PMOS transistors to prevent the implantation of dopant ions during Step 456.

Steps 456 and 458 include using an ion implantation angle in the range between 30° and 70° from the vertical sidewall of the gate electrode. In some aspects of the invention, the ion implantation angle is approximately 60°.

FIG. 24 is a flowchart illustrating a method for forming a drain extension region underlying the gate electrode. Step 500 provides for the fabrication of a MOS transistor having an isolated silicon region to form a source, a drain. A gate electrode overlies the silicon region. The gate electrode has a length extending from the source to the drain, and vertical sidewalls adjoining the source and drain. Step 502 selects an angle, defined from the vertical sidewall of the gate electrode adjacent the drain region. Step 502 includes selecting an angle in the range between 30° and 70° from the vertical sidewall of the gate electrode adjacent the drain region. Step 504 implants ions of dopant, at the angle defined in Step 502, into the silicon region underlying the gate electrode adjacent the drain, to form the drain extension region with a length less than the gate electrode length. The drain extension region length extends from underneath the vertical sidewall of the gate electrode adjacent the drain region, toward the source region. Step 506 is a product, where the drain extension maximizes the operation voltage of the transistor.

A transistor structure and fabrication method have been provided which eliminate the need for LDD areas on either side of the channel region. Elimination of LDD areas reduces the number of masking and doping steps required to manufacture a transistor. Further, the drain extension area promotes transistor performance. The drain extension eliminates the LDD region between the channel and the source, and so minimizes source resistance. At the same time, the doped drain extension area insures that the drain resistance through the drain extension remains low. Other variations and embodiments of the invention will occur to those skilled in the art.

What is claimed is:

1. In the fabrication of transistors selected from the group consisting of NMOS and PMOS transistors, a method for forming asymmetric channel regions and drain extension regions comprising the steps of:
    a) isolating a region of silicon, from which a source, a drain, and a channel region between the source and drain, are subsequently formed, and doping the region;
    b) forming a gate electrode region overlying the silicon region, the gate electrode region having a length extending from the source to the drain, and vertical sidewalls adjoining the source and drain;
    c) forming the channel region by implanting ions of dopant at a predetermined angle, defined from the gate electrode vertical sidewall adjacent the source, into the silicon region underlying the gate to form a channel region having a length less than the gate length, the channel region extending from underneath the gate electrode vertical sidewall directly adjacent the source, toward the drain; and
    d) forming the drain extension by implanting ions of: dopant at a predetermined angle, defined from the gate electrode vertical sidewall adjacent the drain, into the silicon region underlying the gate, the drain extension region extending from underneath the gate electrode vertical sidewall directly adjacent the drain, toward the source, whereby a transistor is formed with a high breakdown voltage and low source resistance.

2. A method as in claim 1 in which Step c) occurs before Step d).

3. A method as in claim 1 in which Step d) occurs before Step c).

4. A method as in claim 1 in which the doping of Step a) includes implanting ions of a first dopant at a first doping density, in which Step c) includes implanting a second dopant at a second ion dose and second ion energy level, and in which Step d) includes implanting a third dopant at a third ion does and third energy level.

5. A method as in claim 4 including further steps, following Step d), of.
    e) implanting a fourth dopant at a fourth ion dose and fourth ion energy level, to form gate, source and drain regions;
    f) depositing a layer of oxide over the source, drain, and gate regions of the transistor;
    g) forming contact holes through the oxide deposited in Step f), to the source, drain, and gate regions; and
    h) depositing metal in the contact holes, forming independent electrical connections to the source, drain, and gate.

6. A method as in claim 1 in which Step c) includes masking the drain region to prevent the implantation of dopant ions during Step c).

7. A method as in claim 1 in which Step d) includes masking the source region to prevent the implantation of dopant ions during Step d).

8. A method as in claim 1 in which Steps c) and d) includes using an ion implantation angle in the range between 30° and 70° from the vertical sidewall of the gate electrode adjoining the drain and source, respectively.

9. A method as in claim 8 in which the ion implantation angle is approximately 60°.

10. A method as in claim 1 in which Step a) includes forming the silicon region to be doped from the group consisting of bulk silicon and silicon on insulator (SOI).

11. A method as in claim 10 wherein the MOS transistor is an NMOS transistor, and in which Step a) includes forming the silicon region from bulk silicon with boron as the first dopant, and in which the first doping density in the range between $1 \times 10^{15}$ and $1 \times 10^{17}/cm^3$, whereby a p-doped silicon region is formed.

12. A method as in claim 4 in which Step c) includes a second dopant selected from the group consisting of boron and $BF_2$, in which the second ion dose is in the range between $1 \times 10^{13}$ and $1 \times 10^{15}/cm^2$, in which the second ion energy level is in the range between 2 keV and 30 keV when the second dopant is boron, and in which the second ion energy level is in the range between 10 keV and 150 keV when the second dopant is $BF_2$, whereby a short p-channel region is formed.

13. A method as in claim 4 in which Step d) includes a third dopant selected from the group consisting of phosphorus and arsenic, in which the third ion dose is in the range between $1 \times 10^{13}$ and $1 \times 10^{15}/cm^2$, in which the third ion energy level is in the range between 10 keV and 100 keV when the third dopant is phosphorus, and in which the third ion energy level is in the range between 20 keV and 200 keV when the third dopant is arsenic, whereby a drain extension region is formed.

14. A method as in claim 5 in which Step e) includes the fourth dopant being selected from the group consisting of phosphorus and arsenic, in which the fourth ion dose is in the range between $1 \times 10^{15}$ and $1 \times 10^{16}/cm^2$, in which the fourth ion energy level is in the range between 5 keV and 20 keV when the fourth dopant is phosphorus, and in which the fourth ion energy level is in the range between 10 keV and 40 keV when the fourth dopant is arsenic, whereby n+ gate, source, and drain regions are formed.

15. A method as in claim 10 wherein the MOS transistor is a PMOS transistor, and in which Step a) includes forming the silicon region from bulk silicon, and using a first dopant selected from the group consisting of phosphorous and arsenic at a first doping density in the range between $1 \times 10^{15}$ and $1 \times 10^{17}/cm^3$, whereby an n-doped silicon region is formed.

16. A method as in claim 4 in which Step c) includes a second dopant selected from the group consisting of phosphorus and arsenic, in which the second ion dose is in the range between $1 \times 10^{13}$ and $1 \times 10^{15}/cm^2$, in which the second ion energy level is in the range between 10 keV and 100 keV when the second dopant is phosphorus, and in which the second ion energy level is in the range between 20 keV and 200 keV when the second dopant is arsenic, whereby a short n-channel region is formed.

17. A method as in claim 4 in which Step d) includes the third dopant being selected from the group consisting of $BF_2$ and boron, in which the third ion dose is in the range between $1 \times 10^{13}$ and $1 \times 10^{15}/cm^2$, in which the third ion energy level is in the range between 10 keV and 150 keV when the third dopant is $BF_2$, and in which the third ion energy level is in the range between 2 keV and 30 keV when the third dopant is boron, whereby a p drain extension region is formed.

18. A method as in claim 5 in which Step e) includes the fourth dopant being selected from the group consisting of $BF_2$ and boron, in which the fourth ion dose is in the range between $1 \times 10^{15}$ and $1 \times 10^{16}/cm^2$, in which the fourth ion energy level is in the range between 10 keV and 50 keV when the fourth dopant is $BF_2$, and in which the fourth ion energy level is in the range between 2 keV and 10 keV when the fourth dopant is boron, whereby p+ gate, source, and drain regions are formed.

19. A method as in claim 1 including the further step, following Steps c) and d), of:
   i) heating the transistor to a temperature in the range between 850 and 1100° C., for a time in the range between 30 minutes and 60 minutes to diffuse the dopant implanted in Steps c) and d), whereby an asymmetrical channel and drain extension are formed when the angle of implantation is shallow.

20. A method as in claim 1 in which Step b) includes forming a gate electrode having a length of less than approximately 0.5 microns.

21. In the fabrication of N+/P+ Dual Poly Gate CMOS transistors, a method for forming asymmetric channel regions, and drain extension regions comprising the steps of:
   a) isolating a regions of silicon, from which a source, a drain, and a channel region between the source and drain, are subsequently formed, and doping the regions;
   b) forming gate electrode regions overlying the silicon region, each gate electrode region having a length extending from the source to the drain, and vertical sidewalls adjoining the source and drain;
   c) forming the channel region in the NMOS transistors by implanting ions of dopant at a predetermined angle, defined from the gate electrode vertical sidewall adjacent the source, into the silicon region underlying the gate to form a channel region having a length less than the gate length, extending from underneath the gate electrode vertical sidewall directly adjacent the source, toward the drain, while simultaneously forming the drain extension region in the PMOS transistors by implanting ions of dopant at a predetermined angle, defined from the gate electrode vertical sidewall adjacent the drain, into the silicon region underlying the gate to form a drain extension extending from underneath the gate electrode vertical sidewall directly adjacent the drain, toward the source; and
   d) forming the drain extension in NMOS transistors by implanting ions of dopant at a predetermined angle, defined from the gate electrode vertical sidewall adjacent the drain, into the silicon region underlying the gate to form the drain extension region extending from underneath the gate electrode vertical sidewall directly adjacent the drain, toward the source, while simultaneously forming the channel region in the PMOS transistors by implanting ions of dopant at a predetermined angle, defined from the gate electrode vertical sidewall adjacent the source, into the silicon region underlying the gate to form a channel region having a length less than the gate length, extending from underneath the gate electrode vertical sidewall directly adjacent the source, toward the drain, whereby a transistor is formed with a high breakdown voltage and low source resistance.

22. A method as in claim 21 in which Step c) occurs before Step d).

23. A method as in claim 21 in which Step d) occurs before Step c).

24. A method as in claim 21 in which Step c) includes masking the drain regions of the NMOS transistors and the source regions of the PMOS transistors to prevent the implantation of dopant ions during Step c).

25. A method as in claim 21 in which Step d) includes masking the drain regions of the PMOS transistors and the source regions of the NMOS transistors to prevent the implantation of dopant ions during Step d).

26. A method as in claim 21 in which Steps c) and d) include using an ion implantation angle in the range between 30° and 70° from the vertical sidewall of the gate electrode.

27. A method as in claim 26 in which the ion implantation angle is approximately 60°.

28. In the fabrication of a MOS transistor having an isolated silicon region to form a source, a drain, and a gate electrode overlying the silicon region, the gate electrode having a length extending from the source to the drain and vertical sidewalls adjoining the source and drain, a method for forming a drain extension region underlying the gate electrode comprising the steps of:
   a) selecting an angle, defined from the vertical sidewall of the gate electrode adjacent the drain region;
   b) implanting ions of dopant, at the angle defined in Step a), into the silicon region underlying the gate electrode adjacent the drain, to form the drain extension region with a length less than the gate electrode length, the drain extension region length extending from underneath the vertical sidewall of the gate electrode adjacent the drain region, toward the source region, whereby the drain extension region maximizes the operation voltage.

29. A method as in claim 28 in which Step a) includes selecting an angle in the range between 30° and 70° from the vertical sidewall of the gate electrode adjacent the drain region.

* * * * *